United States Patent
Blanchard et al.

(10) Patent No.: US 8,878,238 B2
(45) Date of Patent: Nov. 4, 2014

(54) MCT DEVICE WITH BASE-WIDTH-DETERMINED LATCHING AND NON-LATCHING STATES

(71) Applicant: Pakal Technologies LLC, San Francisco, CA (US)

(72) Inventors: Richard A. Blanchard, Los Altos, CA (US); Hidenori Akiyama, Miyagi (JP); Woytek Tworzydlo, Austin, TX (US)

(73) Assignee: Pakal Technologies LLC, San Francisco, CA (US)

( * ) Notice: Subject to any disclaimer, the term of this patent is extended or adjusted under 35 U.S.C. 154(b) by 49 days.

(21) Appl. No.: 13/632,991

(22) Filed: Oct. 1, 2012

(65) Prior Publication Data
US 2014/0091358 A1    Apr. 3, 2014

(51) Int. Cl.
*H01L 29/749* (2006.01)
*H01L 29/06* (2006.01)
H01L 29/423 (2006.01)
H01L 29/745 (2006.01)

(52) U.S. Cl.
CPC ........ *H01L 29/7455* (2013.01); *H01L 29/0696* (2013.01); *H01L 29/42308* (2013.01); *H01L 29/749* (2013.01)
USPC ........................................ 257/139

(58) Field of Classification Search
CPC ............ H01L 29/7455; H01L 29/0696; H01L 29/749
USPC .......... 257/107, 110, 117, 122, 127, 139, 330
See application file for complete search history.

(56) References Cited

U.S. PATENT DOCUMENTS

| | | | |
|---|---|---|---|
| 6,091,107 A | 7/2000 | Amaratunga et al. | |
| 6,683,343 B2 * | 1/2004 | Matsudai et al. | 257/328 |
| 8,552,500 B2 * | 10/2013 | Dennard et al. | 257/350 |
| 8,604,514 B2 * | 12/2013 | Tanaka | 257/139 |
| 2005/0045960 A1 | 3/2005 | Takahashi | |
| 2009/0020852 A1 | 1/2009 | Harada | |
| 2010/0193835 A1 | 8/2010 | Hshieh | |

FOREIGN PATENT DOCUMENTS

JP    05243561 A    9/1993

OTHER PUBLICATIONS

PCT/US2012/058361 International Search Report and Written Opinion, 19 pages.

* cited by examiner

*Primary Examiner* — Nathan Ha
(74) *Attorney, Agent, or Firm* — Patent Law Group LLP; Brian D Ogonowsky

(57) ABSTRACT

Methods and systems for a gate-controlled thyristor which switches between narrow-base operation in the ON state and wide-base operation in the OFF state, and which can only sustain latch-up in the narrow-base ON state.

20 Claims, 6 Drawing Sheets

MCT DEVICE WITH BASE-WIDTH-DETERMINED LATCHING AND NON-LATCHING STATES

CROSS-REFERENCE

Priority is claimed from U.S. 61/540,819, filed Sep. 29, 2011, which is hereby incorporated by reference.

BACKGROUND

The present application relates to thyristor devices, and more particularly to gate-controlled bipolar semiconductor devices which achieve a conductive latchup state which can be turned off by a small gate signal.

Note that the points discussed below may reflect the hindsight gained from the disclosed inventions, and are not necessarily admitted to be prior art.

A thyristor is a four-layer solid-state structure which has long been an attractive candidate for high-current switches. Thyristors combine very high current ratings with very high voltage-withstand capabilities, which makes this class of devices the leading candidate for very high voltage switches and for handling very high power. For example, as of 2012, off-the-shelf packaged thyristors can withstand more than 10,000 Volts, and can switch more than 10 Megawatts of power in each unit. However, the basic thyristor structure cannot be turned off by just returning the "turn-on" terminal to 0 Volts, or even to a small negative voltage. Once it is turned on, it stays on for as long as it can draw a minimum holding current.

The basic thyristor structure can be thought of as a merged structure which combines a PNP bipolar transistor with an NPN bipolar transistor. Each of these bipolar transistors provides the base current of the other, so there is potentially a positive feedback relationship: the collector current in the NPN is the base current of the PNP, and the collector current of the PNP is the base current of the NPN. The gain of a bipolar transistor is normally stated as "beta" ($\beta$), which is the ratio of collector current to base current. In a thyristor, there will be positive feedback if the product of the two betas is greater than one ($\beta_{NPN} \cdot \beta_{PNP} > 1$). If this positive feedback relation is present, then, whenever the thyristor is turned ON, it will draw current up to the maximum the external terminals can supply, or until the bipolar devices reach saturation.

When this basic thyristor is OFF, the junction between the n-base and p-base regions will be reverse biased, and this condition blocks conduction. (The anode will be connected to a voltage which is more positive than the cathode voltage.) A depletion region, with a width depending on the applied voltage, will be present on both sides of this pn-junction formed by the base of the NPN transistor and the base of the PNP transistor. The two other junctions will be forward biased, but no current flows (other than leakage), since the reverse biased junction is present.

When the thyristor is ON, conduction is as follows. (Note that current is carried by both electrons and holes flowing in opposite directions, but current in the conventional sense only flows in one direction.) Holes will pass from the p+ anode region through the n-base region into the p-base region, and thence into the n+ cathode (where they will typically recombine with the majority carriers, which in the n+ region are electrons). Since the holes have positive charge, their movement means that current (in the conventional sense) flows from the anode to the cathode. Similarly, electrons will pass from the n+ cathode region through the p-base region into the n-base region, and thence into the p+ anode (where they will typically recombine with the majority carriers, which in this region are holes). Since the electrons have negative charge, their movement means that current (in the conventional sense) is opposite to the physical movement of the electrons, i.e. current flows from the anode to the cathode. Since current is carried by both electrons and holes, this thyristor is a bipolar (or "minority carrier") device, and operates quite differently than unipolar (or "majority carrier") devices, such as field-effect transistors, where current flows because of the motion of only one carrier type.

When a thyristor has been turned ON, it is electrically analogous to a simple junction diode, but with a lower forward voltage drop than a junction diode.

Issued U.S. Pat. No. 7,705,368 to Rodov and Akiyama, which is commonly owned with the present application, described a fundamentally new structure for a MOS-controlled thyristor ("MCT"). The present application provides improvements on the structures and methods disclosed in that patent.

Turn-on in an MCT is relatively simple, but turn-off is the more difficult challenge in this technology. The Rodov et al. patent describes (among other teachings) a MOS-controlled thyristor in which a mesa of n-type semiconductor between the cathode contact and the n-emitter/p-base junction can be depleted by a sufficiently negative gate voltage (applied to a trench gate). The gate trench extends down through the n+ emitter layer, and into, but not through, the p-base layer. The voltage on the gate electrode can cause depletion of the p-type material in these mesas, which "pinches off" the connection to the cathode terminal, and thereby interrupts conduction. However, a mesa width of less than the Debye length is required for the gate to turn the Rodov et al. device OFF. This gate-to-gate distance is typically 1 micron or less in such a thyristor device. For a discrete power device, this is very small and will result in a high manufacturing cost. The Rodov et al. device benefits from trench gate oxide thicknesses as small as 10 nm or so, but this further increases manufacturing costs and lowers the yield.

The thyristor devices of Rodov et al. have great advantages over IGBTs, but the Rodov et al. devices usually require that the gate voltage be pulsed positive to turn the device ON and negative to turn the device OFF. A power circuit used to control this type of thyristor device would therefore be quite different from the power circuit used to drive most IGBTs, in which the gate voltage is held constant while in the ON state, and returned to zero volts to turn the IGBT off.

SUMMARY

The present application discloses new approaches to gate-controlled thyristors. There are some apparent structural similarities to Rodov—e.g., a trench gate is still used—but with important differences in structure and operation. With no gate voltage applied, the product of the gain of the NPN times the gain of the PNP is preferably less than unity. This means that even if the device is somehow triggered into conduction, it will not latch. However, if the trench gate is turned on (driven sufficiently positive), an inversion layer forms at the trench sidewalls and bottom. In this inversion layer, electrons are the majority carriers, so the population of electrons at the bottom of the trench provides a "virtual emitter" for the NPN bipolar transistor. The behavior of the NPN is now determined by this virtual (induced) emitter, not by the n+ diffusion at the top surface. In effect, the NPN device has been changed from a wide-base bipolar transistor, with correspondingly low gain, to a bipolar NPN with a much narrower base. As with any bipolar transistor, a reduction in base width, while other device parameters remain unchanged, greatly increases the gain (beta) of this transistor. Thus the gate can change the NPN from being a wide-base transistor to being a narrow-base transistor.

The disclosed innovations, in various embodiments, provide one or more of at least the following advantages. However, not all of these advantages result from every one of the innovations disclosed, and this list of advantages does not limit the various claimed inventions.

Low ON voltage;
High performance;
Decreased manufacturing cost;
Can be controlled by the same drive circuit as would be used for an IGBT; and
Allows use of wider trench distances and thicker trench gate oxides than the most preferred teachings of Rodov.

BRIEF DESCRIPTION OF THE DRAWINGS

The disclosed inventions will be described with reference to the accompanying drawings, which show important sample embodiments and which are incorporated in the specification hereof by reference, wherein:

FIG. 3B shows an equivalent circuit of the present IGTO biased ON.

DETAILED DESCRIPTION OF SAMPLE EMBODIMENTS

Figure 1:
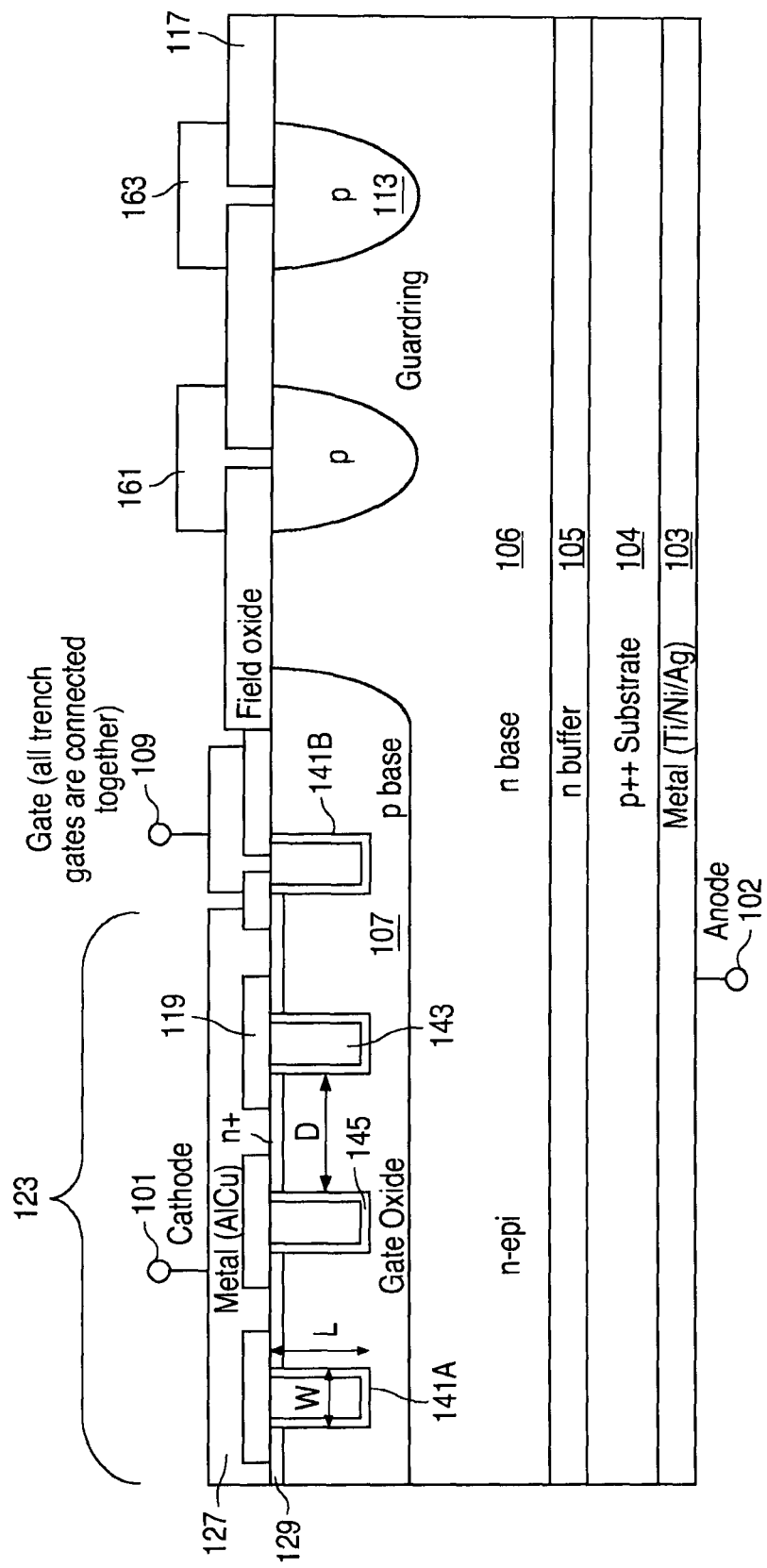
FIG. 1 schematically shows a cross section of an IGTO embodiment of the present invention.

The numerous innovative teachings of the present application will be described with particular reference to presently preferred embodiments (by way of example, and not of limitation). The present application describes several inventions, and none of the statements below should be taken as limiting the claims generally.

In general, a thyristor can be thought of as the combination of a reverse-biased junction (the base-base junction), which provides all the voltage withstand in the OFF state, with two base-emitter junctions on opposite sides of the base-base junction. (These two additional junctions are electrically in series with the base-base junction.) In the ON state, the combination of the two emitter-base junctions provides net round-trip carrier multiplication, so the device latches when it is turned on.

Rodov et al. U.S. Pat. No. 7,705,368 describes a gated thyristor device where the connection to one of the emitters is pinched off to interrupt conduction. The Rodov et al. patent apparently does not say that the combination of the two metallurgical emitter-base junctions will not latch if such pinch-off is not present. The present application specifically teaches that thicknesses and dopings should be selected so that the combination of the two metallurgical emitter-base junctions will not latch by themselves.

Thus the preferred implementations disclosed in the present application differ from the preferred implementations of Rodov et al. both in structure and in function. The structure is different, in that the two metallurgical emitter-base junctions do not provide net round-trip carrier multiplication by themselves (i.e. not unless a portion of the upper base has been inverted). That translates into different thicknesses and/or dopings and/or carrier lifetimes, as discussed below. The function is surprisingly different, in that carrier multiplication between the two emitter-base junctions does not have to be disabled in the OFF state.

An important further difference is that the Rodov structure apparently requires that the active area be completely surrounded by the trench where the gate is contacted. This helps to assure that uncontrolled conduction does not occur if the areas of carrier multiplication have not been properly terminated. By contrast, in the device of FIG. 1, this is not strictly necessary, since conduction will not be sustained unless the device is ON.

To analyze carrier multiplication, a crucial relation is the product of the NPN and PNP current gains: if (at the relevant voltage and current)

$$\beta_{NPN}\beta_{PNP}>1,$$

then the device will latch when triggered; but if $$\beta_{NPN}\beta_{PNP}<1,$$

the device will not sustain conduction, even if it has already been turned on.

The disclosed inventions, by changing the gain of the NPN transistor, allow BOTH of these states to be achieved. The relevant relations are now:

$$\beta_{NPN\text{-}wide}<1/\beta_{PNP}, \text{ and}$$

$$\beta_{NPN\text{-}narrow}>1/\beta_{PNP}.$$

That is, the NPN beta is not only changed by shifting between wide-base and narrow-base behaviors, but the product of the betas must change between a value which is less than unity in the OFF state, and a value which is greater than unity in the ON state. There are two additional tools which can be used to assure that these two beta-products fall on different sides of unity.

In addition to the switch between wide-base and narrow-base operation, it is also possible to lower both gains by reducing carrier lifetime. This can be done by introducing deep-level dopants (such as gold or platinum), or by irradiation using electrons or other high energy particles, followed by an anneal. This carrier lifetime reduction has unexpected synergy when used in combination with switching between wide- and narrow-base operation.

In the narrow-base condition, conduction is preferably initiated merely by placing a positive voltage on the anode terminal. The positive voltage on the anode attracts electrons from the virtual emitter induced at the trench bottom (i.e. the population of electrons in the inversion layer induced in the p-base layer at the bottom of the gate trench). Electrons will flow through the portion of the p-base below the trench, to initiate the positive-feedback relation which turns the device fully ON.

In order to fabricate the innovative structure, e.g. like that shown in FIG. 1, the starting material would be a P++ substrate, e.g. of silicon. (The disclosed innovations can also be applied to other semiconductor materials, and can be particularly advantageous in wider-bandgap semiconductor materials, such as Group III nitrides or silicon carbide.) The three terminals of the present device are shown as cathode terminal 101, anode terminal 102, and gate terminal 109.

An n-type buffer layer 105 is grown epitaxially on the P++ starting substrate 104. An epitaxial layer 106 is then grown on top of the N type buffer layer 105. The doping of the substrate 104 can be, for example, 0.001-0.020 Ω·cm. The doping of the N-type buffer 105 can be, for example, $10^{14}$-$10^{16}$ cm$^{-3}$. The doping of the N-type epitaxial layer 106 can be e.g. $10^{13}$-$10^{15}$ cm$^{-3}$. This dopant concentration can be obtained e.g. by in-situ doping during epi growth.

A P-type base region 107 is then implanted. Preferably the guard rings 113 are also formed in the same patterned implant. The peak doping in the P-type base region 107 can be, for example, $10^{16}$-$10^{18}$ cm$^{-3}$.

Additional field oxide 117 is then grown to a thickness of, for example, 0.6-1.5 microns. The field oxide 117 is then preferentially etched from the emitter areas 123 using a masked etch.

A masked implant is used to create the shallow N+ layer 129. This can be very heavily doped, and can be formed, e.g., by an implant of arsenic or phosphorus at an energy of 10-100 keV and an area dose of $5\times10^{14}$-$10^{16}$ cm$^{-2}$.

In one example embodiment, the inter-level dielectric 119 is 0.6-1.2 microns thick of silicon dioxide, and the field oxide 117 is 0.6-1.5 microns thick of silicon dioxide. However, these can of course be varied.

Patterning of the inter-level dielectric 119 exposes contacts, where the metal 127 can make contact to a shallow N+ region 129. The N+ region 129 provides the emitter of the NPN transistor, and also provides ohmic contact to the cathode metallization 127. The cathode metallization 127 in this example is an aluminum-copper alloy, but can of course be made of other materials, as is well known. Barrier metallization can also be used at the contact if desired.

Either before or after the masked implant which forms the N+-emitter, trenches 141 are etched in the active area. Note that this trench etch preferably creates two locations as seen in the top view of FIG. 6. The gates which are connected to control conduction from the cathode through the adjacent part of P base 107 are preferably surrounded by a line of trenches 141B in which contact can be made to the gate electrode. Thus the gate electrode is a buried mesh within the surface of the semiconductor material. Preferably the trench gate portions 141B either surround the active gate portions 141A, or else totally outflank it as shown in FIGS. 4A-4B and 5A-5C.

In one embodiment, the trench depths can be e.g. 2-10 microns, but the minimum lateral trench widths are constrained by lithographic and etching limitations.

After trenches 141 are etched, a gate oxide 145 is preferably grown on the sidewalls and bottoms of those gates. This gate oxide 145 is relatively thin, and can be, for example, 0.05-0.15 microns thick. A conductive material 143, e.g. heavily doped polysilicon, then fills the trenches 141, and is, in the example shown, planarized to the surface of the semiconductor material. Alternatively, it is also possible to recess the gate electrodes slightly, or to have them protrude slightly, as long as they are insulated from the cathode metal 127.

Note that the voltage withstand requirements of the gate oxide 145 are not very high since the gate electrodes 143A and 143B are close in potential to the cathode metal 127, and since the structure is preferably architected so that breakdown occurs first at the periphery.

The location of the origin of the "breakdown" of the reverse biased pn-junction is a function of a number of variables, including the geometry of the doped regions in the "termination," the junction depths in this region, and dopant profiles in this region. (This complex relationship is discussed, for instance in Chapter 3 of *Power Semiconductor Devices* by B. Jayant Baliga, PWS Publishing Company, 1996.)

One or more second metal regions 161 and 163 preferably make contact to concentric guard rings 113. This structure helps to assure that when breakdown happens, the fragile gate oxides in the active area will not be damaged.

The backside of the semiconductor wafer can then be coated with a contact metallization of Ti/Ni/Ag 103 to which contact is made to provide the large anode current. Typically high current voltages of this type will be packaged in a plastic power package such as a TO-220 or TO-252 package. Fabrication is completed with protective overcoat and external contact formation.

Figure 1A:
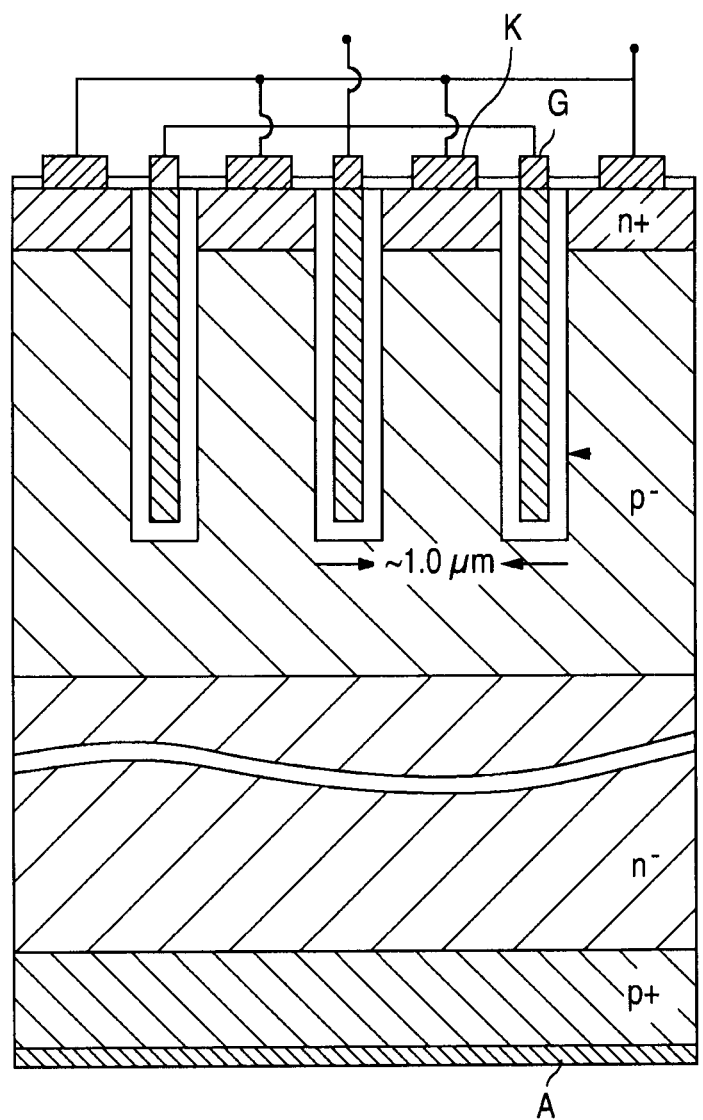
FIG. 1A shows a known IGTO device.
Figure 1B:
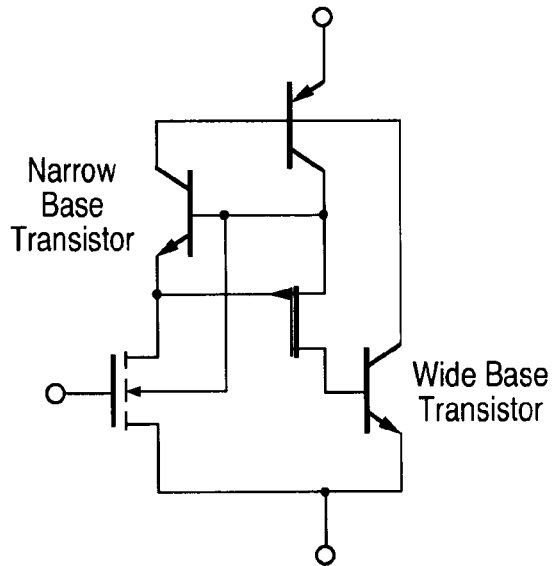
FIG. 1B shows its equivalent circuit.

FIG. 1A shows a prior art IGTO, and FIG. 1B shows its equivalent circuit. Several of the dimensions noted, particularly the 10-nm thickness of gate oxide and the ~1.0-micron spacing between gates, are those noted above as increasing manufacturing cost and decreasing yield in said prior IGTO.

Figure 2:
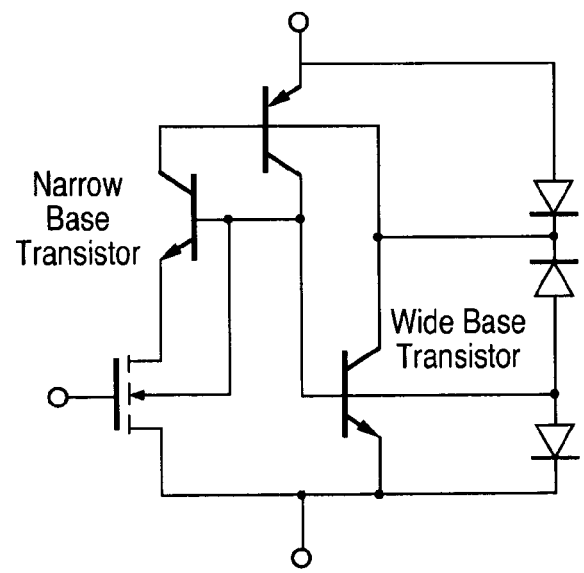
FIG. 2 shows an equivalent circuit of the device of FIG. 1.

An equivalent circuit of the device of FIG. 1 is shown in FIG. 2. This figure is drawn conventionally, with the most positive terminal, the P++ substrate metal electrode, at the top of the schematic, and the n-type cathode at the bottom. (Note that following this convention results in an equivalent circuit that is "upside down" when compared to the cross section of FIG. 1.) The three main components shown in the equivalent circuit of this device are as follows: a PNP transistor with the P++ substrate forming its emitter, an n-type base, and the p-type region near the top surface as its collector; an NPN transistor with the N+ top layer as its emitter, a p-type base, and an n-type collector; and a trench MOSFET with the N+ top layer as its source, a p-type body, an n-type drain and its gate in the trench.

Figure 3A:
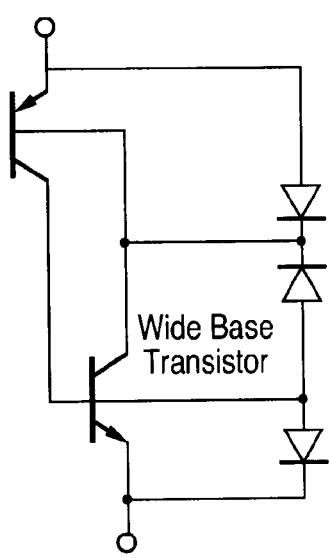
FIG. 3A shows an equivalent circuit of the present IGTO biased OFF.
Figure 3B:
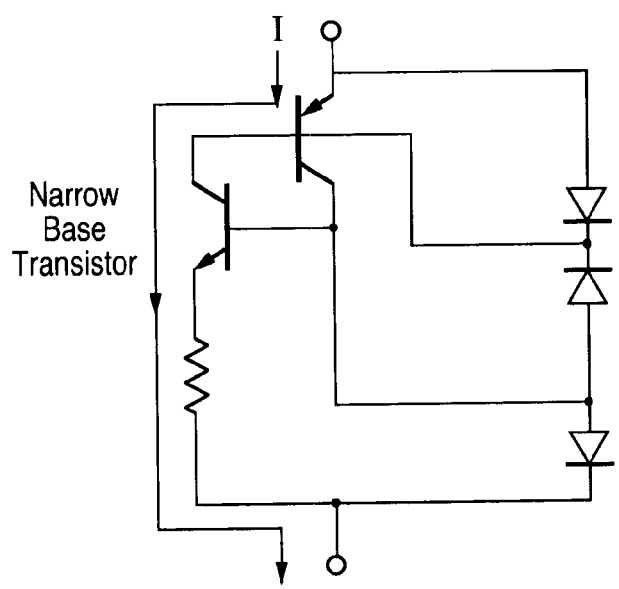

With a positive voltage on the anode, no current flows between the anode and cathode with zero volts or with a negative voltage applied between the gate and the cathode. However, when a positive voltage of, for example, +10V is applied to the gate, the device turns ON, and behaves as seen in e.g. FIG. 3B. When the driving gate voltage drops below the minimum needed to maintain the virtual emitter for narrow-base operation, the device turns OFF, and behaves as in FIG. 3A.

Figure 4A:
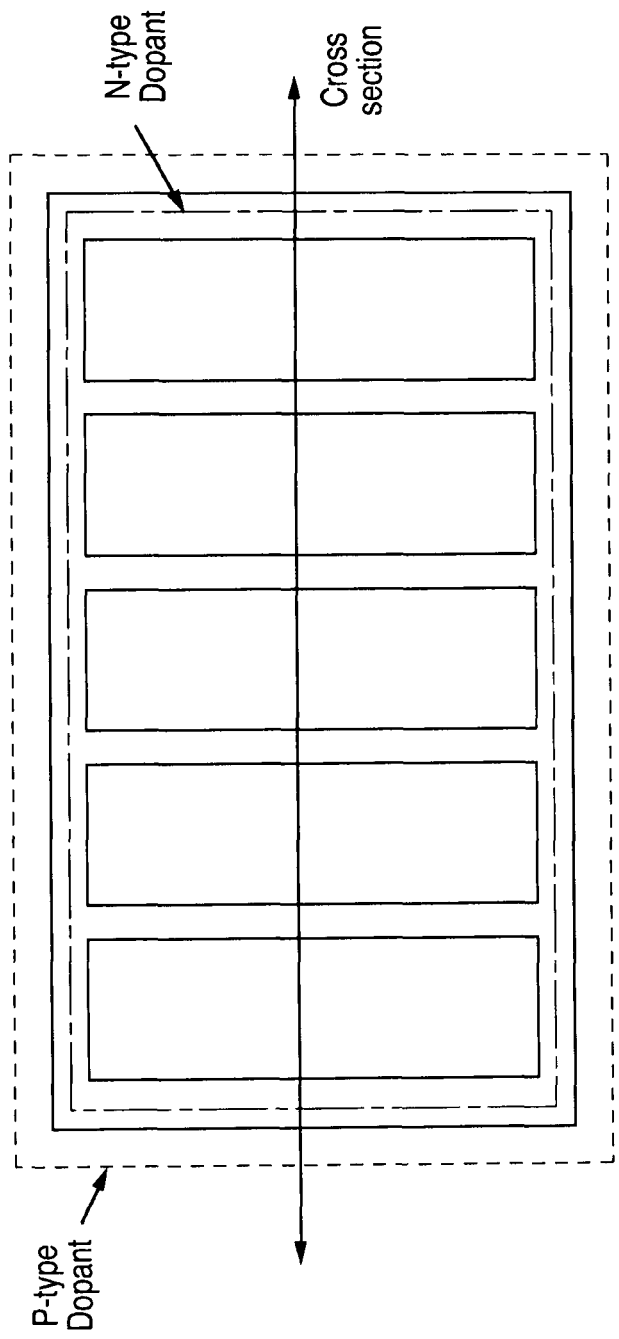
FIGS. 4A-4B show a top view of a closed gate structure and the corresponding p-type and N+ type diffused regions.
Figure 4B:
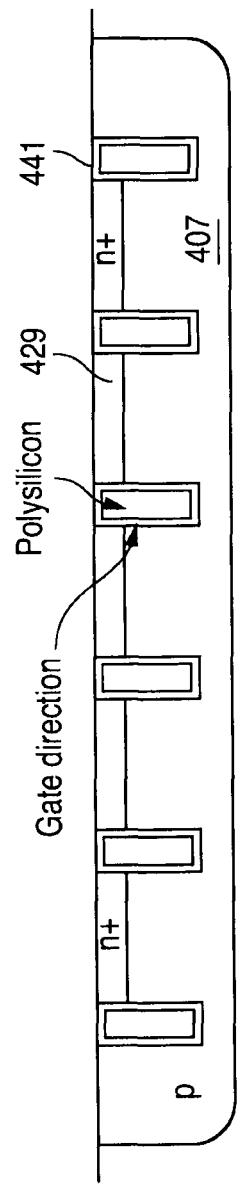

FIG. 4A shows one example of a top view of a closed gate structure in which the trench gate structures surround the active gate portions, with FIG. 4B showing the corresponding p-type and N+ diffused regions.

Figure 5A:
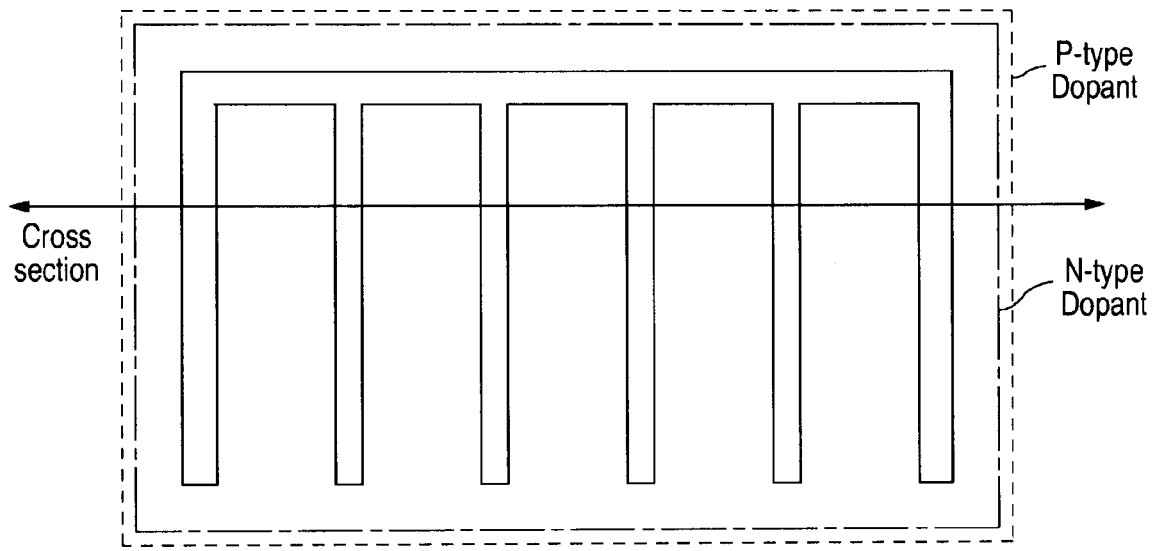
FIGS. 5A-5C show top views of open gate structures and the corresponding p-type and N+ type diffused regions.
Figure 5B:
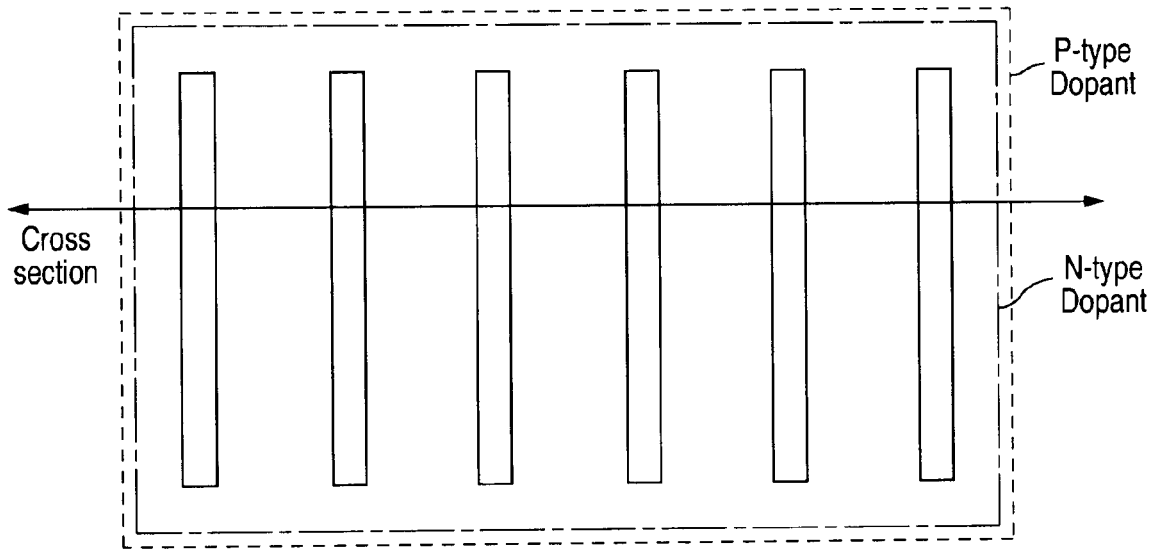
Figure 5C:
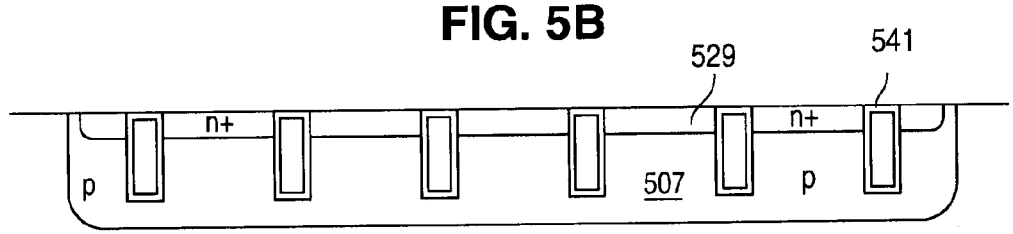

FIGS. 5A and 5B show top views of two alternatives for open gate structures with the corresponding p-type and N+ diffused regions shown in FIG. 5C. Note that where N+ active regions 429 end at gate trench 441 in FIG. 4B, corresponding N+ active regions 529 continue past corresponding gate trench 541 in FIG. 5C.

Figure 6:
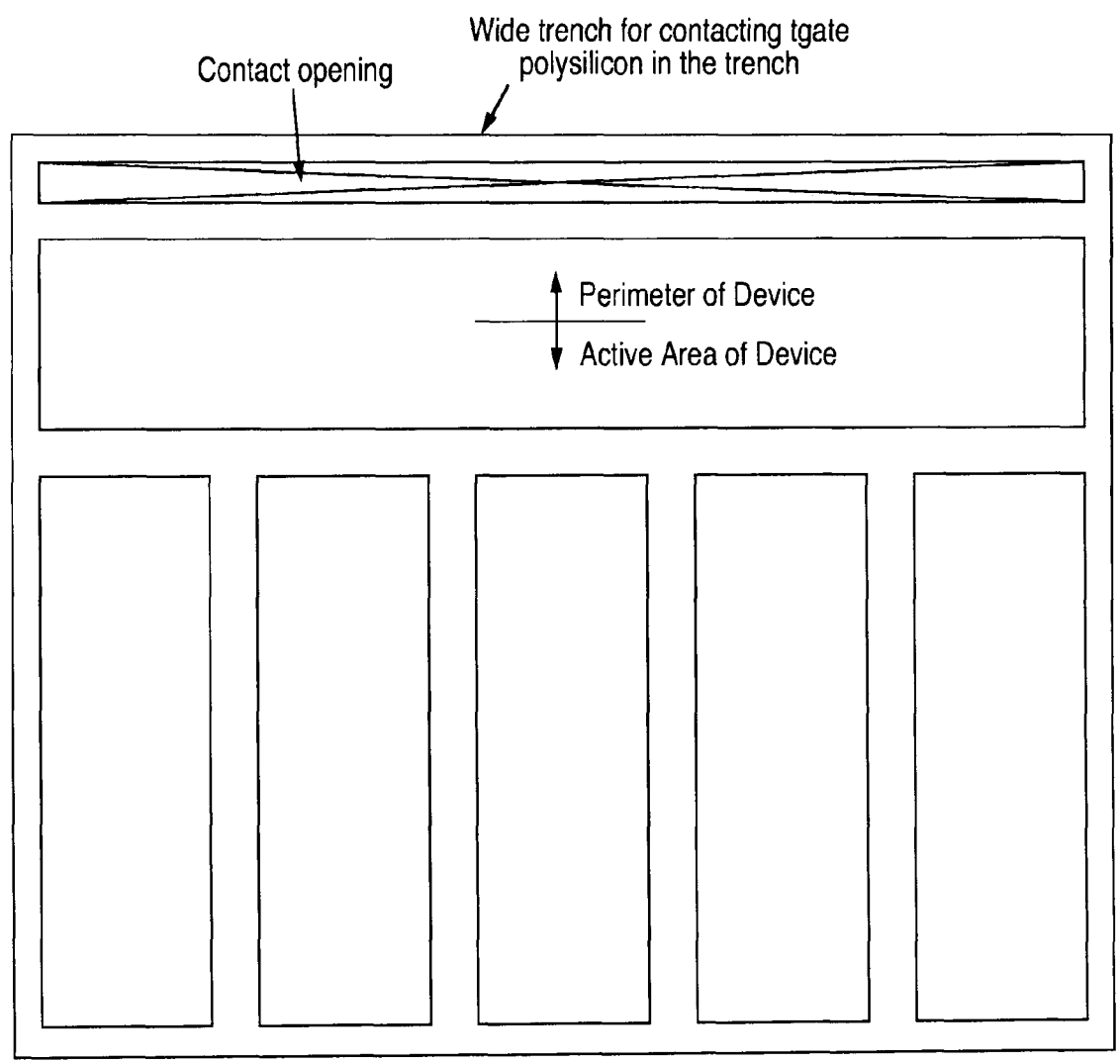
FIG. 6 shows an example of making contact to the gate of the present IGTO.

FIG. 6 shows the location where electrical contact is made to the polysilicon in the gate trenches. By placing these gate contact regions at the outer perimeter of the active area, the metal that contacts the n+ emitter/source region can be continuous.

At the end of these fabrication steps, carrier lifetime is preferably reduced. This is preferably done by gold or platinum implant, but can alternatively be done by electron irradiation. Carrier lifetime is reduced sufficiently that the two emitter-base junctions will not latch if the trench gate is not inverting parts of the adjacent base region.

According to some but not necessarily all embodiments, there is provided: A gate-controlled thyristor, comprising: an n-type emitter region, overlying a p-type base region, which itself overlies an n-type base region, which in turn overlies a heavily doped p-type emitter region; one or more insulated gate electrodes lying in gate trenches which extend down into, but not through, said p-type base region; wherein the NPN current gain defined by the combination of said n-type emitter with said p-type base and said n-type base, multiplied by the PNP current gain defined by the combination of said p-type emitter with said n-type base and said p-type base, is less than one; and wherein, at times when said gate electrode has been driven sufficiently positive to invert portions of said p-type base region, the NPN current gain defined by the combination of an induced population of electrons at the bottom of said trench with said p-type base and said n-type base, multiplied by the PNP current gain defined by the combination of said p-type emitter with said n-type base and said p-type base, is greater than one; whereby, when said gate electrode is sufficiently positive to invert said p-base region, current will flow from said anode to said cathode terminal under forward bias; and when said gate electrode is not sufficiently positive to invert said p-base region, current from said anode to said cathode will be interrupted.

According to some but not necessarily all embodiments, there is provided: A semiconductor device for controllable bipolar conduction at a rated voltage, comprising: an active area, including one or more first emitter regions of a first conductivity type overlying a first semiconductor base region of a second conductivity type; an upper part of said first base region being partially penetrated by one or more trenches which contain an insulated gate electrode, and which surround or partially surround mesa portions of said first base region; a base-base junction, underlying said first base region, which is separated from the bottoms of said trenches by a thickness of said first base region which is sufficient that some of said first base region below the bottoms of said trenches is not fully depleted when the device is off and is withstanding the rated voltage; a second base region of said first conductivity type, which is separated from said first base region by said base-base junction, and a second emitter region of said second conductivity type; and external connections to said first and second emitter regions, and to said gate; wherein, when said gate electrode has a potential which inverts adjacent portions of said upper part, the combination of said second emitter region, said second base region, said first base region, and an induced population of first-conductivity-type carriers near the bottom of said trenches, provides enough secondary carrier generation to remain latched into an ON state once conduction has begun; and wherein the combination of said first emitter and said first base region, together with the combination of said second emitter and said second base region, do not provide enough secondary carrier generation to remain latched into an ON state once conduction has begun, unless said induced population is present.

According to some but not necessarily all embodiments, there is provided: A gate-controlled thyristor, comprising: a heavily doped first-conductivity-type emitter region, overlying a second-conductivity-type base region, which itself overlies a first-conductivity-type base region, which in turn overlies a heavily doped second-conductivity-type emitter region; one or more insulated gate electrodes lying in gate trenches which extend down through more than 10%, but less than 90%, of the depth of said p-type base region; and wherein, at times when said gate electrode has been driven sufficiently positive to invert portions of said p-type base region, the NPN current gain defined by the combination of an induced population of electrons at the bottom of said trench with said p-type base and said n-type base, multiplied by the PNP current gain defined by the combination of said p-type emitter with said n-type base and said p-type base, is greater than one; whereby, when said gate electrode is sufficiently positive to invert said p-base region, current will flow from said anode to said cathode terminal if forward bias is present; and when said gate electrode is not sufficiently positive to invert said p-base region, current from said anode to said cathode will stop.

According to some but not necessarily all embodiments, there is provided: A gate-controlled thyristor, comprising: a heavily-doped n-type emitter region, overlying a p-type base region, which itself overlies an n-type base region, which in turn overlies a heavily doped p-type emitter region; one or more insulated gate electrodes lying in gate trenches which extend down into, but not through, said p-type base region; wherein said thyristor cannot sustain conduction unless sufficient positive voltage is applied to said gate electrode.

According to some but not necessarily all embodiments, there is provided: A semiconductor active device with bipolar conduction, comprising: a first semiconductor region which contains an excess of first-type charge carriers; and a second semiconductor region which contains an excess of second-type charge carriers; a first pn-junction to said first region, and a second pn-junction to said second region; said first and second pn-junctions having the same orientation; a third pn-junction, which separates said first and second pn-junctions, and has an orientation opposite to that of said first and second pn-junctions; a third semiconductor region which is switchably connected to said first location, which is closer than said first region to said third pn-junction, and which, when connected to said first location, provides an excess of first-type charge carriers; wherein, when the third region is not connected to the first region, the combination of said first, second, and third junctions will not latch to sustain conduction across said third junction; and when the third region is connected to the first region, the combination of said first, second, and third junctions will latch to sustain conduction across said third junction under at least some circumstances.

According to some but not necessarily all embodiments, there is provided: An insulated gate type three terminal thyristor comprising: a first semiconductor emitter region of a first conductivity type having a first impurity concentration; a first semiconductor base region of a second conductivity type opposite to the first conductivity type having a second impurity concentration and formed on said first current terminal semiconductor region; a second semiconductor base region of the first conductivity type having a third impurity concentration lower than the first impurity concentration and formed on said first semiconductor base region; a second semiconductor emitter region of the second conductivity type having a fourth impurity concentration higher than the second impurity concentration and formed on said second semiconductor base region; a trench structure passing through said first semiconductor emitter region and entering said first semiconductor base region without reaching the second semiconductor base region; and an insulated gate electrode structure formed in said trench structure, wherein said trench structure divides an upper portion of said first base semiconductor region into a plurality of regions, and is formed generally around part, but not all of, each divided region.

According to some but not necessarily all embodiments, there is provided: A solid-state switching method, comprising, in a structure which has a first emitter region over a first base region over a second base region over a second emitter region, with a trench extending into part but not all of the thickness of the first base region, and a gate electrode in the trench: when conduction is desired, connecting the gate electrode to a first voltage which is sufficient to invert adjacent portions of said first base region, and thereby create a population of first-conductivity-type mobile charge carriers at the bottoms of the trenches; and when conduction is not desired, then connecting the gate electrode to a second voltage which neither inverts nor depletes through portions of said first base region between the trenches; wherein net round-trip carrier multiplication occurs between said population and the second emitter region when the gate is connected to the first voltage, and does not occur when the gate is connected to the second voltage.

According to some but not necessarily all embodiments, there is provided: A method of operating a thyristor device, comprising: when conduction is desired, turning on a field effect transistor to reduce the base width of one bipolar transistor component of the thyristor; and when blocking is desired, turning off said field effect transistor, without pinching off conduction through the base region of said bipolar transistor.

According to some but not necessarily all embodiments, there is provided: A method of operating a high-power semiconductor device having at least three successively opposed junctions in series, comprising: when conduction is desired, turning on a field effect transistor to reduce the effective spacing between two of said junctions; and when blocking is desired, turning off said field effect transistor, without pinching off conduction through mesa portions of the device.

According to some but not necessarily all embodiments, there is provided: Methods and systems for a gate-controlled thyristor which switches between narrow-base operation in the ON state and wide-base operation in the OFF state, and which can only sustain latch-up in the narrow-base ON state.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In one contemplated possibility, transistor base width change can be performed at the anode rather than the cathode by changing the NMOS gate on the cathode face of the die to a PMOS gate on the anode face of the die.

In a further contemplated possibility, one can also perform base width change on both faces of the die, by using two-sided processing. Note that the NMOS gate and PMOS gate would not have to be precisely aligned, as long as the active gated areas on the two faces were aligned. In fact, in one contemplated implementation, the gate trenches for the NMOS and PMOS can be arranged orthogonally.

In another contemplated possibility, an alternative technique for beta control which can be used in combination with the wide-base/narrow-base change is emitter-base shorting. If the NPN's base voltage is tied to its emitter voltage (as described earlier), the NPN's emitter junction is bypassed, and can never be forward biased. This guarantees that the beta will be less than one, and possibly close to zero. However, this technique requires additional device structure.

In a further contemplated possibility, one can reduce carrier lifetimes through electron irradiation only at selected distances from the top of the device. In an embodiment in which such selective-level lifetime-reduction is desired, the regions between the base-emitter junctions might frequently be the desired target areas.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A gate-controlled thyristor, comprising:
    an n-type emitter region, overlying a p-type base region, which itself overlies an n-type base region, which in turn overlies a heavily doped p-type emitter region,
    wherein the n-type emitter region, the p-type base region, and the n-type base region form an NPN transistor,
    wherein the p-type emitter region, the n-type base region, and the p-type base region form a PNP transistor;
    one or more insulated gate electrodes lying in gate trenches which extend down into, but not through, said p-type base region;
    wherein the NPN transistor current gain defined by the combination of said n-type emitter region with said p-type base region and said n-type base region, multiplied by the PNP transistor current gain defined by the combination of said p-type emitter region with said n-type base region and said p-type base region, is less than one;
    wherein, at times when said one or more insulated gate electrodes have been driven sufficiently positive to invert portions of said p-type base region, the NPN transistor current gain defined by the combination of an induced population of electrons at the bottom of said trench with said p-type base region and said n-type base region, multiplied by the PNP transistor current gain defined by the combination of said p-type emitter region with said n-type base region and said p-type base region, is greater than one;
    whereby, when said gate electrode is sufficiently positive to invert said p-base region, current will flow from an anode terminal to a cathode terminal under forward bias; and when said one or more insulated gate electrodes are not sufficiently positive to invert said p-base region, current from said anode terminal to said cathode terminal will be interrupted,
    and wherein a p-type dopant concentration in the p-type base region and a depth and location of the one or more insulated gate electrodes into the p-type base region are such that no vertical or lateral n-type inversion channel between the n-type emitter region and the n-type base region is created in the p-type base region when the one or more insulated gate electrodes have been driven sufficiently positive to cause the current to flow from the anode terminal to the cathode terminal.

2. The thyristor of claim 1, wherein said one or more insulated gate electrodes are made of doped polysilicon.

3. The thyristor of claim 1, wherein each said base region is made of silicon.

4. The thyristor of claim 1, wherein one of said base regions is an epitaxial layer, and the other of said base regions is a well region formed within said epitaxial layer.

5. The thyristor of claim 1, wherein the top of said one or more insulated gate electrodes are below the top of said trench.

6. The thyristor of claim 1, wherein each said base region is made of silicon, and said one or more insulated gate electrodes are insulated therefrom by a layer of grown silicon dioxide.

7. A gate-controlled thyristor, comprising:
a heavily doped n-type emitter region, overlying a p-type base region, which itself overlies an n-type base region, which in turn overlies a heavily doped p-type emitter region,
wherein the n-type emitter region, the p-type base region, and the n-type base region form an NPN transistor,
wherein the p-type emitter region, the n-type base region, and the p-type base region form a PNP transistor;
one or more insulated gate electrodes lying in gate trenches which extend down through more than 10%, but less than 90%, of the depth of said p-type base region;
wherein the NPN transistor current gain defined by the combination of said n-type emitter region with said p-type base region and said n-type base region, multiplied by the PNP transistor current gain defined by the combination of said p-type emitter region with said n-type base region and said p-type base region, is less than one;
wherein, at times when said one or more insulated gate electrodes have been driven sufficiently positive to invert portions of said p-type base region, the NPN transistor current gain defined by the combination of an induced population of electrons at the bottom of said trench with said p-type base region and said n-type base region, multiplied by the PNP transistor current gain defined by the combination of said p-type emitter region with said n-type base region and said p-type base region, is greater than one;
whereby, when said one or more insulated gate electrodes are-sufficiently positive to invert said p-base region, current will flow from an anode terminal to a cathode terminal if forward bias is present; and when said gate electrode is not sufficiently positive to invert said p-base region, current from said anode terminal to said cathode terminal will stop,
and wherein a p-type dopant concentration in the p-type base region and a depth and location of the one or more insulated gate electrodes into the p-type base region are such that no vertical or lateral n-type inversion channel between the n-type emitter region and the n-type base region is created in the p-type base region when the gate electrode has been driven sufficiently positive to cause the current to flow from the anode terminal to the cathode terminal.

8. The thyristor of claim 7, wherein said one or more insulated gate electrodes are made of doped polysilicon.

9. The thyristor of claim 7, wherein each said base region is made of silicon.

10. The thyristor of claim 7, wherein one of said base regions is an epitaxial layer, and the other of said base regions is a well region formed within said epitaxial layer.

11. The thyristor of claim 7, wherein the top of said one or more insulated gate electrodes are below the top of said trench.

12. The thyristor of claim 7, wherein the bottom of said trench is more than 1.5 microns above the junction between said base regions.

13. The thyristor of claim 7, wherein each said base region is made of silicon, and said one or more insulated gate electrodes are insulated therefrom by a layer of grown silicon dioxide.

14. The thyristor of claim 7, wherein said trench extends down through more than 40%, but less than 80%, of the depth of said respective base region.

15. A gate-controlled thyristor, comprising:
a heavily-doped n-type emitter region, overlying a p-type base region, which itself overlies an n-type base region, which in turn overlies a heavily doped p-type emitter region,
wherein the n-type emitter region, the p-type base region, and the n-type base region form an NPN transistor,
wherein the p-type emitter region, the n-type base region, and the p-type base region form a PNP transistor;
one or more insulated gate electrodes lying in gate trenches which extend down into, but not through, said p-type base region;
wherein said thyristor cannot sustain conduction unless sufficient positive voltage is applied to said one or more insulated gate electrodes,
wherein the NPN transistor current gain defined by the combination of said n-type emitter region with said p-type base region and said n-type base region, multiplied by the PNP transistor current gain defined by the combination of said p-type emitter region with said n-type base region and said p-type base region, is less than one;
wherein, at times when said one or more insulated gate electrodes have been driven sufficiently positive to invert portions of said p-type base region, the NPN transistor current gain defined by the combination of an induced population of electrons at the bottom of said trenches with said p-type base region and said n-type base region, multiplied by the PNP transistor current gain defined by the combination of said p-type emitter region with said n-type base region and said p-type base region, is greater than one;
whereby, when said one or more insulated gate electrodes are sufficiently positive to invert said p-base region, current will flow from an anode terminal to a cathode terminal if forward bias is present; and when said one or more insulated gate electrodes are not sufficiently positive to invert said p-base region, current from said anode terminal to said cathode will stop,
and wherein a p-type dopant concentration in the p-type base region and a depth and location of the one or more insulated gate electrodes into the p-type base region are such that no vertical or lateral n-type inversion channel between the n-type emitter region and the n-type base region is created in the p-type base region when the gate electrode has been driven sufficiently positive to cause the current to flow from the anode terminal to the cathode terminal.

16. The thyristor of claim 15, wherein said thyristor cannot enter latch-up unless sufficient voltage is applied to said one or more insulated gate electrodes.

17. The thyristor of claim 15, wherein said thyristor can sustain conduction when sufficient positive voltage is applied to said one or more insulated gate electrodes; and wherein said thyristor cannot sustain conduction when no voltage or a negative voltage is applied to said one or more insulated gate electrodes.

18. The thyristor of claim 15, wherein said one or more insulated gate electrodes are made of doped polysilicon.

19. The thyristor of claim 15, wherein each said base region is made of silicon.

20. The thyristor of claim 15, wherein one of said base regions is an epitaxial layer, and the other of said base regions is a well region formed within said epitaxial layer.

* * * * *